United States Patent
Sato et al.

(10) Patent No.: US 12,482,689 B2
(45) Date of Patent: Nov. 25, 2025

(54) ELECTROSTATIC CHUCK

(71) Applicant: SHINKO ELECTRIC INDUSTRIES CO., LTD., Nagano (JP)

(72) Inventors: Keita Sato, Nagano (JP); Yohei Yamada, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 507 days.

(21) Appl. No.: 17/983,528

(22) Filed: Nov. 9, 2022

(65) Prior Publication Data

US 2023/0142870 A1    May 11, 2023

(30) Foreign Application Priority Data

Nov. 10, 2021   (JP) ................. 2021-183550

(51) Int. Cl.
*H01L 21/683*   (2006.01)
*C09J 5/04*   (2006.01)
*C09J 201/00*   (2006.01)

(52) U.S. Cl.
CPC ............ *H01L 21/6833* (2013.01); *C09J 5/04* (2013.01); *C09J 201/00* (2013.01)

(58) Field of Classification Search
CPC ................................. H01L 21/6833
See application file for complete search history.

(56) References Cited

U.S. PATENT DOCUMENTS

| | | |
|---|---|---|
| 9,627,240 B2 | 4/2017 | Yamaguchi et al. |
| 11,575,335 B2 | 2/2023 | Moriya |
| 2011/0096460 A1 | 4/2011 | Yonekura et al. |

FOREIGN PATENT DOCUMENTS

| | | |
|---|---|---|
| JP | 2007-194320 A | 8/2007 |
| JP | 2011-91297 A | 5/2011 |
| JP | 2016-12733 A | 1/2016 |
| JP | 2020-023088 | 2/2020 |
| JP | 2021-66757 A | 4/2021 |
| JP | 2021-113327 A | 8/2021 |
| JP | 2021-158334 A | 10/2021 |

OTHER PUBLICATIONS

JP 2020-023088 Machine translation (Year: 2020).*
Japanese Office Action dated Apr. 1, 2025 issued in corresponding Japanese application No. 2021-183550; English machine translation included (8 pages).

* cited by examiner

*Primary Examiner* — Zachary M Davis
(74) *Attorney, Agent, or Firm* — Rankin, Hill & Clark LLP (57) ABSTRACT

An electrostatic chuck includes a base plate, a ceramic plate fixed to the base plate and including an electrode embedded in the ceramic plate, and a resin layer bonding the base plate and the ceramic plate and including one or more adhesives. In at least one of the one or more adhesives, a temperature corresponding to an extreme value of a loss tangent in a temperature range of −150° C. to 250° C. is −70° C. or lower.

7 Claims, 6 Drawing Sheets

| THICKNESS OF ADHESIVE (mm) | DELAMINATION | TEMPERATURE DIFFERENCE ON ADSORPTION SURFACE(°C) |
|---|---|---|
| 0.3 | NO DELAMINATION | 1.2 |
| 0.25 | NO DELAMINATION | 2.1 |
| 0.2 | DELAMINATION/ NO DELAMINATION | 11.7/1.2 |
| 0.15 | DELAMINATION | 4.4 |

ELECTROSTATIC CHUCK

CROSS-REFERENCE TO RELATED APPLICATIONS

This application is based on and claims the benefit of priority from prior Japanese patent application No. 2021-183550 filed on Nov. 10, 2021, the entire contents of which are incorporated herein by reference.

TECHNICAL FIELD

The present invention relates to an electrostatic chuck.

BACKGROUND ART

For example, when manufacturing a semiconductor component and the like, an electrostatic chuck (ESC) configured to adsorb and hold a wafer may be used. The electrostatic chuck has a structure in which a ceramic plate having an electrode embedded therein is bonded to a metallic base plate by a resin layer. The electrostatic chuck is configured to adsorb the wafer to the ceramic plate by using an electrostatic force when a voltage is applied to the electrode embedded in the ceramic plate.

As an adhesive forming the resin layer, for example, a flexible silicone resin-based adhesive is used so as to favorably maintain thermal conductivity and to absorb a difference in thermal expansion between the base plate and the ceramic plate.

CITATION LIST

Patent Literature
  Patent Literature 1: JP2020-23088A

SUMMARY OF INVENTION

In the meantime, the manufacturing of a semiconductor component using an electrostatic chuck may be performed at a low temperature of, for example, −60° C. or lower. When the electrostatic chuck is used at the low temperature of −60° C. or lower, the flexibility of the resin layer between the base plate and the ceramic plate in the electrostatic chuck may decrease. This is because a storage elastic modulus, which is a physical property value representing hardness of the adhesive forming the resin layer, rapidly increases near −60° C. and the adhesive is cured. When the flexibility of the resin layer decreases at the low temperature, the stress resulting from a difference in thermal expansion between the base plate and the ceramic plate is not sufficiently relaxed by the resin layer, and as a result, the resin layer may be destroyed. The destruction of the resin layer locally reduces a heat transfer characteristic between the base plate and the ceramic plate via the resin layer, and as a result, reduces temperature uniformity on a surface of the ceramic plate as an adsorption surface.

An object of the present disclosure is to provide an electrostatic chuck capable of suppressing destruction of a resin layer at low temperatures.

According to one aspect of the present disclosure, an electrostatic chuck includes a base plate, a ceramic plate, and a resin layer. The ceramic plate is fixed to the base plate, and is configured to adsorb a target object by an electrostatic force generated by energization to an embedded electrode. The resin layer is a resin layer for bonding the base plate and the ceramic plate, and is formed of one or more laminated adhesives, and at least one of the one or more adhesives has a temperature of −70° C. or lower corresponding to an extreme value of a loss tangent in a temperature range of −150° C. to 250° C.

According to one aspect of the electrostatic chuck of the present disclosure, an effect capable of suppressing destruction of the resin layer at low temperatures is exhibited.

DESCRIPTION OF EMBODIMENTS

Hereinafter, embodiments of the electrostatic chuck of the present disclosure will be described in detail with reference to the drawings. Note that, the disclosed technology is not limited to the embodiments.

Embodiment

Figure 1:
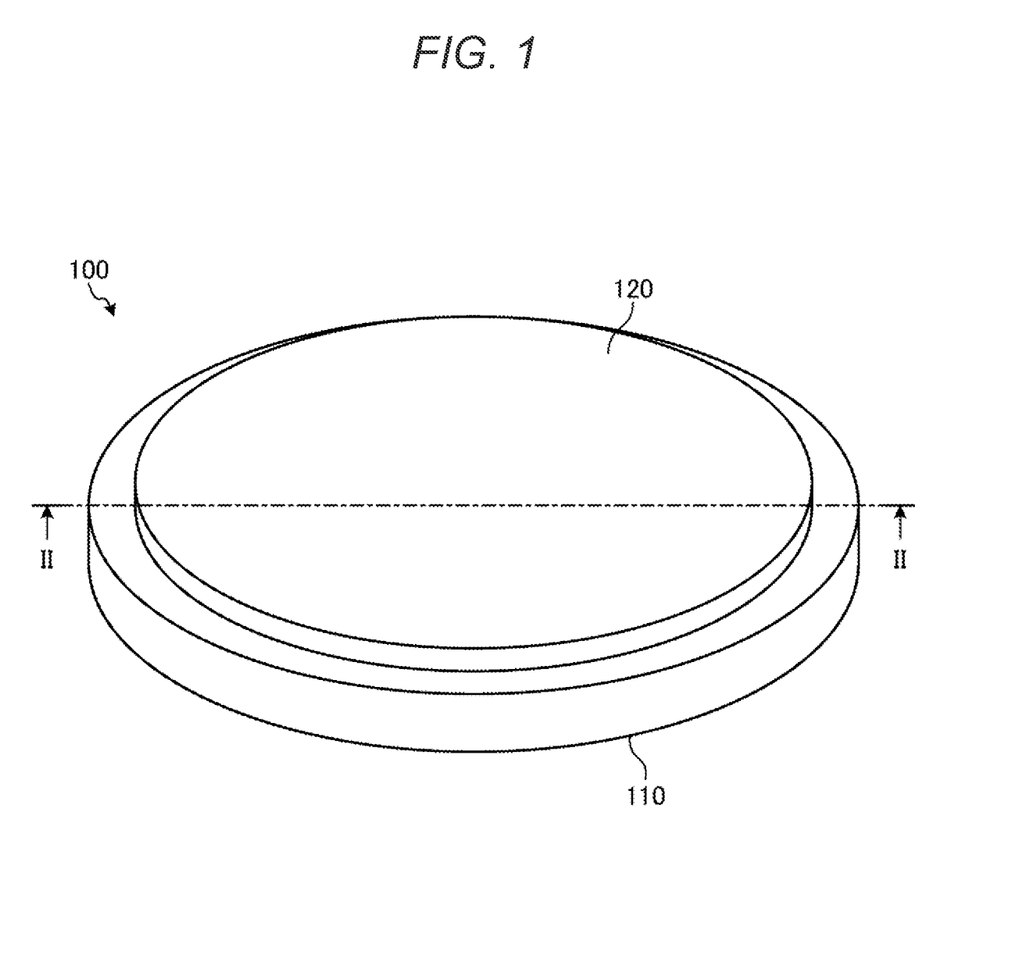
FIG. 1 is a perspective view showing a configuration of an electrostatic chuck according to an embodiment.

FIG. 1 is a perspective view showing a configuration of an electrostatic chuck 100 according to an embodiment. The electrostatic chuck 100 shown in FIG. 1 includes a base plate 110 and a ceramic plate 120.

The base plate 110 is a circular member made of metal such as aluminum, for example. The base plate 110 is a base member of the electrostatic chuck 100. A refrigerant passage through which a refrigerant such as cooling water passes is formed in the base plate 110, so that temperatures of the ceramic plate 120 and a wafer or the like adsorbed to the ceramic plate 120 are adjusted.

The ceramic plate 120 is a circular member made of insulating ceramic. A diameter of the ceramic plate 120 is smaller than a diameter of the base plate 110, and the ceramic plate 120 is fixed to a center of the base plate 110. That is, one surface of the ceramic plate 120 serves as an adhesive surface that is bonded to the base plate 110, and the adhesive surface is bonded to the base plate 110 by the resin layer, so that the ceramic plate 120 is fixed. A surface on an opposite side to the adhesive surface of the ceramic plate 120 is, for example, an adsorption surface for adsorbing a target object such as a wafer to be adsorbed.

A conductive electrode is arranged in the ceramic plate 120, an electrostatic force is generated by energization to the electrode, and the target object is adsorbed to the adsorption surface of the ceramic plate 120 by the electrostatic force.

In addition, a heater electrode is arranged in the ceramic plate 120, and the heater electrode generates heat when energized, thereby adjusting temperatures of the ceramic plate 120 and the target object such as a wafer to be adsorbed to the ceramic plate 120.

Figure 2:
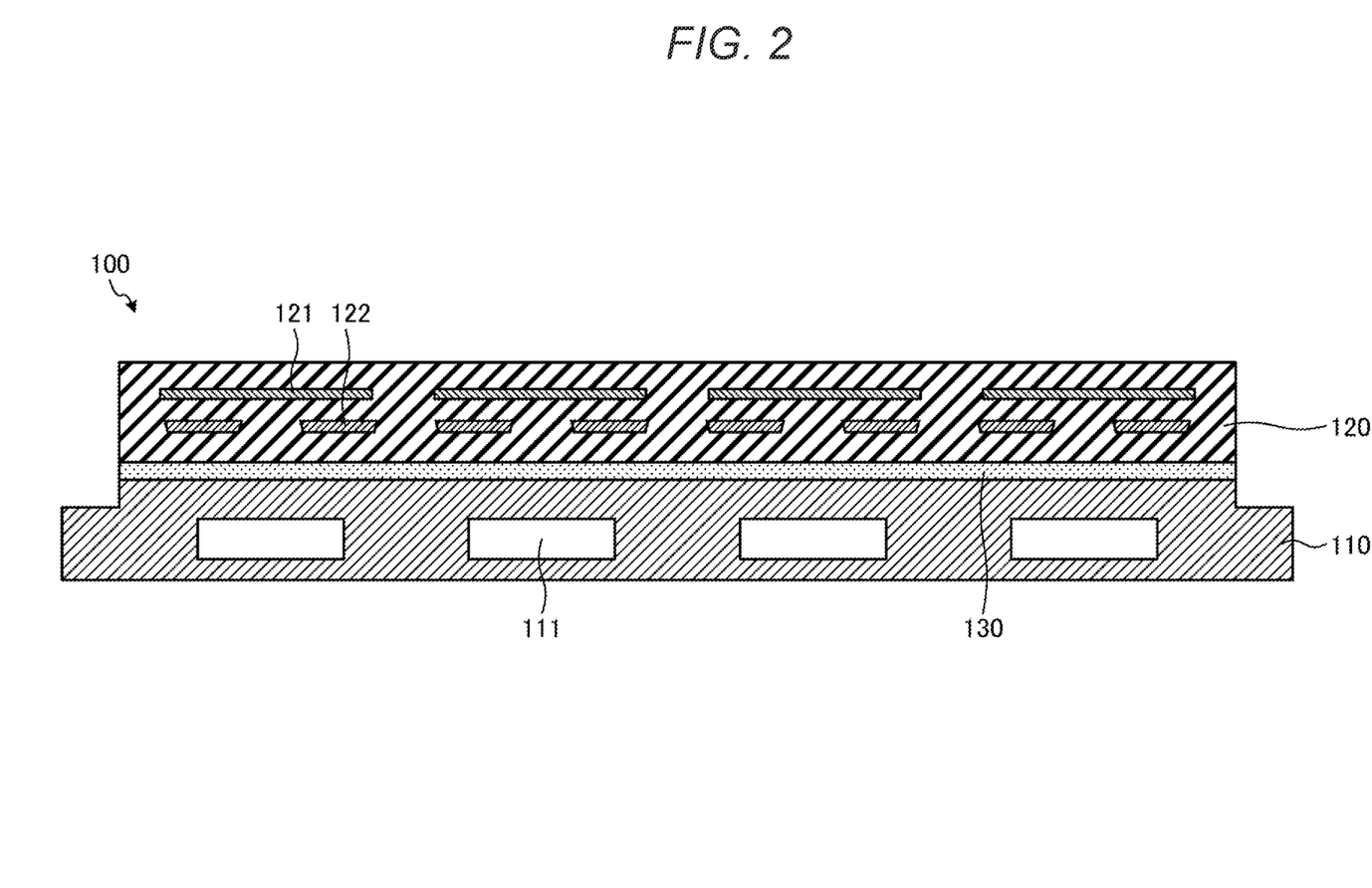
FIG. 2 is a schematic view showing a cross section of the electrostatic chuck according to the embodiment.

FIG. 2 is a schematic view showing a cross section of the electrostatic chuck 100 according to the embodiment. In FIG. 2, a cross section taken along a line II-II in FIG. 1 is shown. As shown in FIG. 2, the electrostatic chuck 100 is configured by bonding the ceramic plate 120 to the base plate 110 via the resin layer 130.

The base plate 110 is, for example, a metallic member having a thickness of about 20 to 50 mm in which a refrigerant passage 111 becoming a passage of refrigerant such as cooling water and cooling gas is formed. The refrigerant passes through the refrigerant passage 111, so that the ceramic plate 120 and the wafer adsorbed to the ceramic plate 120 are cooled. The ceramic plate 120 is cooled, so that the target object such as a wafer adsorbed to the ceramic plate 120 is cooled.

The ceramic plate 120 is, for example, a plate made of ceramic, having a thickness of about 1 mm to 10 mm and including an electrode 121 and a heater electrode 122 therein. The ceramic is obtained by, for example, firing a green sheet fabricated using aluminum oxide. A lower surface of the ceramic plate 120 is an adhesive surface to be bonded to the base plate 110, and is bonded to an upper surface of the base plate 110 by the resin layer 130.

When a voltage is applied to the electrode 121 of the ceramic plate 120, the ceramic plate 120 adsorbs, for example, a target object such as a wafer by an electrostatic force. That is, in FIG. 2, an upper surface of the ceramic plate 120 serves as an adsorption surface, and when a voltage is applied to the electrode 121, the target object is adsorbed to the adsorption surface.

In addition, when a voltage is applied to the heater electrode 122 of the ceramic plate 120, the heater electrode 122 generates heat, so that the ceramic plate 120 is heated and the target object adsorbed to the ceramic plate 120 is heated. The heating by the heater electrode 122 and the cooling by the base plate 110 adjust the temperature of the ceramic plate 120 and adjust the temperature of the target object adsorbed to the ceramic plate 120 to a desired temperature.

As the electrode 121 and the heater electrode 122, for example, a conductor such as tungsten can be used.

Figure 3:
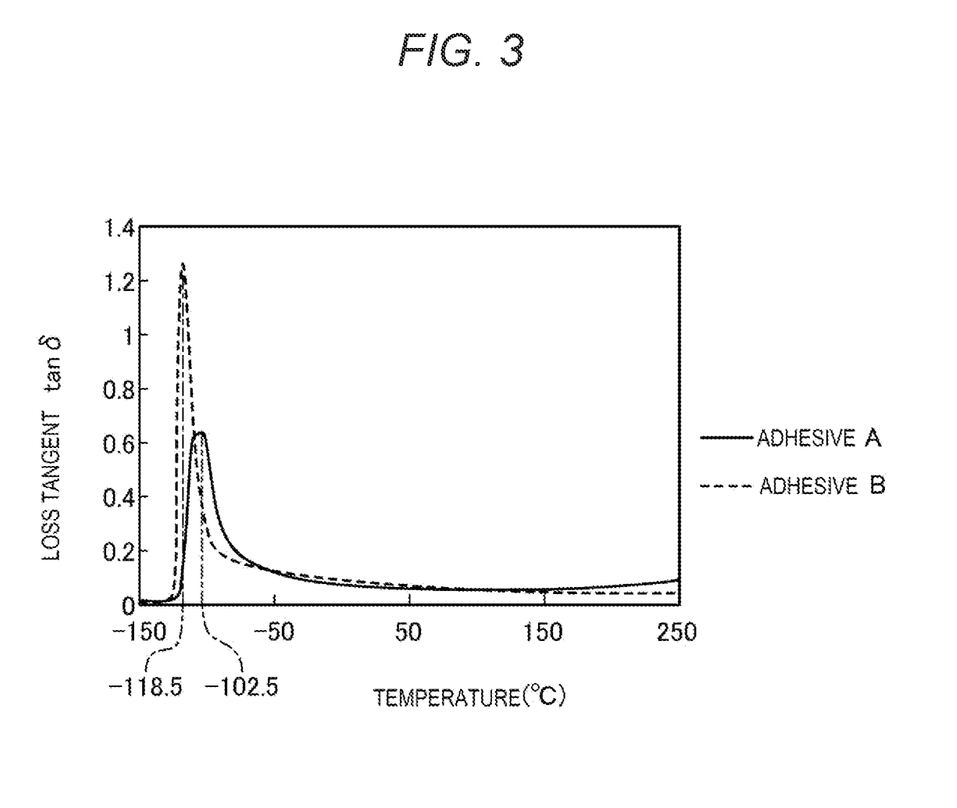
FIG. 3 is a graph showing a measurement result of a loss tangent of an adhesive.

The resin layer 130 is, for example, a layer formed of a silicone resin-based adhesive and having a thickness of about 0.05 mm to 3.0 mm, and bonds the lower surface of the ceramic plate 120 to the upper surface of the base plate 110. In the adhesive forming the resin layer 130, a temperature of corresponding to an extreme value of a loss tangent is −70° C. or lower. FIG. 3 is a graph showing a measurement result of the loss tangent of the adhesive forming the resin layer 130. FIG. 3 shows a measurement result obtained by dynamic viscoelasticity measurement (DMA) for each test piece of an adhesive A and an adhesive B used as the adhesive forming the resin layer 130.

The measurement conditions of the measurement result shown in FIG. 3 are as follows.
  Measurement device: DMA6100 (made by Hitachi High-Tech Corporation)
  Measurement temperature range: −150° C. to 250° C.
  Temperature increase rate: 5° C./min
Measuring Mode: Tensile
  Measurement frequency: 1 Hz
  Shape of test piece: Rectangular shape
  Dimensions of test piece: length 15 mm×width 15 mm×thickness 0.1 to 1 mm
  Distortion amplitude: 10 μm In the DMA, the complex elastic modulus (G*), the storage elastic modulus (G'), and the loss elastic modulus (G") expressed by the following formula (1) were measured.

$$G^* = G' + G''i \qquad (1)$$

Here, the storage elastic modulus (G') is a value representing hardness of the viscoelastic body, and the loss elastic modulus (G') is a value representing the viscosity of the viscoelastic body.

In addition, in the DMA, the loss tangent tan δ represented by the following formula (2) was calculated from the storage elastic modulus (G') and the loss elastic modulus (G"). The loss tangent tan δ is a value representing a degree of contribution of viscosity to the viscoelastic body. The temperature corresponding to the extreme value of the loss tangent tan δ is also called the glass transition temperature (Tg).

$$\tan \delta = G''/G' \qquad (2)$$

As shown in FIG. 3, the measurement data obtained from the test piece shows that, for the adhesive A, the temperature corresponding to the extreme value of the loss tangent tan δ is −102.5° C., and for the adhesive B, the temperature corresponding to the extreme value of the loss tangent tan δ is −118.5° C. That is, it can be seen that the adhesive (adhesive A or adhesive B) forming the resin layer 130 has a temperature corresponding to the extreme value of the loss tangent, i.e., a glass transition temperature (Tg) of −70° C. or lower.

When the glass transition temperature (Tg) of the resin layer 130 is higher than −70° C., the flexibility of the resin layer 130 at a low temperature of −60° C. or lower, for example, may decrease. This is because the storage elastic modulus (G') of the adhesive forming the resin layer 130 rapidly increases near −60° C. and the adhesive is cured. When the flexibility of the resin layer 130 decreases at the low temperature, the stress resulting from a difference in thermal expansion between the base plate 110 and the ceramic plate 120 is not sufficiently relaxed by the resin layer 130, and as a result, the resin layer 130 may be destroyed. The destruction of the resin layer 130 locally lowers the heat transfer characteristic between the base plate 110 and the ceramic plate 120 via the resin layer 130, and as a result, reduces temperature uniformity on the surface of the ceramic plate 120 as an adsorption surface.

In contrast, the resin layer 130 is formed by an adhesive having a glass transition temperature (Tg) of −70° C. or lower in the temperature range of −150° C. to 250° C., so that even when the electrostatic chuck 100 is used at the low temperature of −60° C. or lower, for example, the resin layer 130 maintains favorable flexibility. That is, since the glass transition temperature (Tg) of the resin layer 130 is −70° C. or lower, the storage modulus (G') of the resin layer 130 at the low temperature of −60° C. or lower is maintained at the same level as the value at a room temperature and the curing of the resin layer 130 is suppressed. For this reason, even when the electrostatic chuck 100 is used at the low temperature, the resin layer 130 deforms, and therefore, can sufficiently relax the stress resulting from the difference in thermal expansion between the base plate 110 and the ceramic plate 120. Thereby, the destruction of the resin layer 130 at the low temperature can be suppressed, and as a result, the temperature difference on the adsorption surface of the ceramic plate 120 becomes small, and the electrostatic chuck 100 can obtain the sufficiently high temperature uniformity. The glass transition temperature (Tg) of the adhesive forming the resin layer 130 is more preferably −100° C. or lower.

Further, the adhesive forming the resin layer 130 has a thermal conductivity of 0.5 W/mK or more at −60° C. For example, the adhesive A shown in FIG. 3 has a thermal conductivity of 2.16 W/mK at −60° C., and the adhesive B has a thermal conductivity of 1.12 W/mK at −60° C. Note that, the thermal conductivity is calculated based on the thermal diffusivity, the specific heat capacity, and the density. The thermal diffusivity can be measured by, for example, a laser flash method, the specific heat capacity can be measured by, for example, an adiabatic continuous method, and the density can be measured by, for example, a weighing in liquid method.

If the thermal conductivity at −60° C. of the adhesive forming the resin layer 130 is less than 0.5 W/mK, the thermal conductivity of the resin layer 130 at the low temperature of −60° C. or lower, for example, is lowered. In contrast, the resin layer 130 is formed by an adhesive having a thermal conductivity of 0.5 W/mK or more at −60° C., so that a decrease in thermal conductivity of the resin layer 130 at the low temperature can be suppressed. The thermal conductivity at −60° C. of the adhesive forming the resin layer 130 is preferably 1 W/mK or more.

Figure 4:
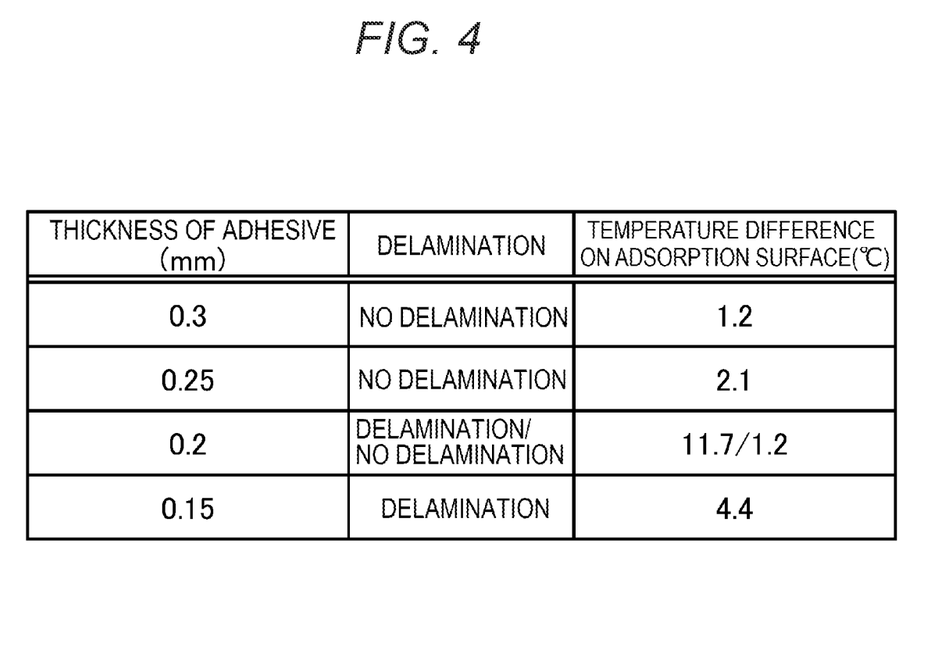
FIG. 4 illustrates an example of a relationship among a thickness of an adhesive forming a resin layer, delamination and temperature uniformity on an adsorption surface.

On the other hand, when the thickness of the resin layer 130 is thin, the resin layer 130 cannot sufficiently relax stress caused by bonding of different materials, which leads to destruction of the resin layer 130. Therefore, the inventors of the present application conducted an experiment to investigate a relationship among the thickness of the adhesive forming the resin layer 130, delamination between layers (delamination), and temperature uniformity on the adsorption surface. A result of this experiment is shown in FIG. 4. FIG. 4 illustrates an example of the relationship among the thickness of the adhesive forming the resin layer 130, delamination and temperature uniformity on the adsorption surface. Note that, delamination between layers (delamination) refers to delamination between the resin layer 130 and the ceramic plate 120, for example.

In the experiment shown in FIG. 4, the thickness of the adhesive forming the resin layer 130 was set to 4 types, a thermal cycle test in a predetermined temperature range was conducted 1000 cycles, and the electrostatic chuck 100 after the thermal cycle test was evaluated as to the presence or absence of occurrence of delamination and the temperature difference on the adsorption surface. In this experiment, the thickness of the adhesive forming the resin layer 130 was set to four types of 0.3 mm, 0.25 mm, 0.2 mm, and 0.15 mm. In addition, in this experiment, the temperature range in the thermal cycle test was set to −40° C. to 60° C.

As shown in FIG. 4, when the thickness of the adhesive was 0.25 mm or more, delamination between the resin layer 130 and the ceramic plate 120 did not occur. In addition, when the thickness of the adhesive was 0.25 mm or more, the temperature difference on the adsorption surface of the ceramic plate 120 was smaller, as compared with a case where the thickness of the adhesive was less than 0.25 mm. That is, it can be seen from the result of FIG. 4 that, when the thickness of the adhesive forming the resin layer 130 is 0.25 mm or more, the occurrence of delamination can be suppressed and high temperature uniformity on the adsorption surface can be maintained. Therefore, it is preferable that the thickness of the adhesive forming the resin layer 130 is 0.25 mm or more.

(Modified Embodiments)

Figure 5:
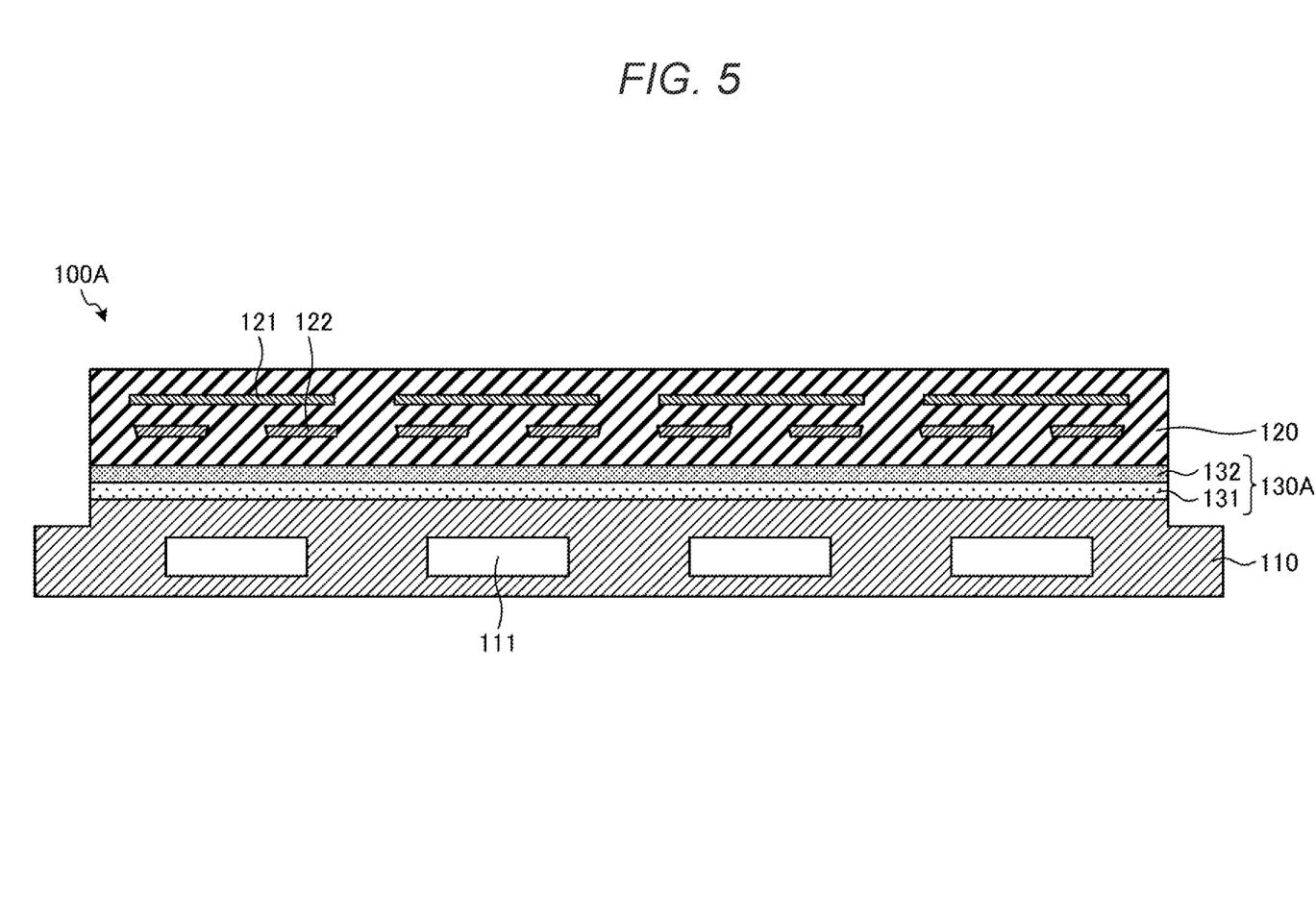
FIG. 5 is a schematic view showing a cross section of an electrostatic chuck according to a first modified embodiment of the embodiment.

Note that, in the above embodiment, the case where the resin layer 130 bonding the base plate 110 and the ceramic plate 120 is formed by the adhesive of one layer has been shown as an example. However, the bonding layer may be formed by laminating a plurality of adhesives. That is, the bonding layer may be formed of one or more laminated adhesives. Specifically, for example, as shown in FIG. 5, in an electrostatic chuck 100A according to a first modified embodiment, a resin layer 130A may be formed by laminating a first adhesive 131 and a second adhesive 132. FIG. 5 is a schematic view showing a cross section of the electrostatic chuck 100A according to the first modified embodiment. The first adhesive 131 is applied to the base plate 110. The second adhesive 132 is applied between the first adhesive 131 and the ceramic plate 120. The first adhesive 131 and the second adhesive 132 each have a temperature corresponding to the extreme value of the loss tangent, i.e., a glass transition temperature (Tg) of −70° C. or lower in the temperature range of −150° C. to 250° C. The glass transition temperature (Tg) of the first adhesive 131 and the glass transition temperature (Tg) of the second adhesive 132 may be the same or different. In this way, by applying the first adhesive 131 and the second adhesive 132 to form the resin layer 130A, deformation of the resin layer 130A at a low temperature is promoted and displacement in a horizontal direction is absorbed, so that the destruction of the resin layer 130 at the low temperature can be further suppressed. Note that, the resin layer 130 may be formed by laminating the sheet-like first adhesive 131 and the sheet-like second adhesive 132.

Figure 6:
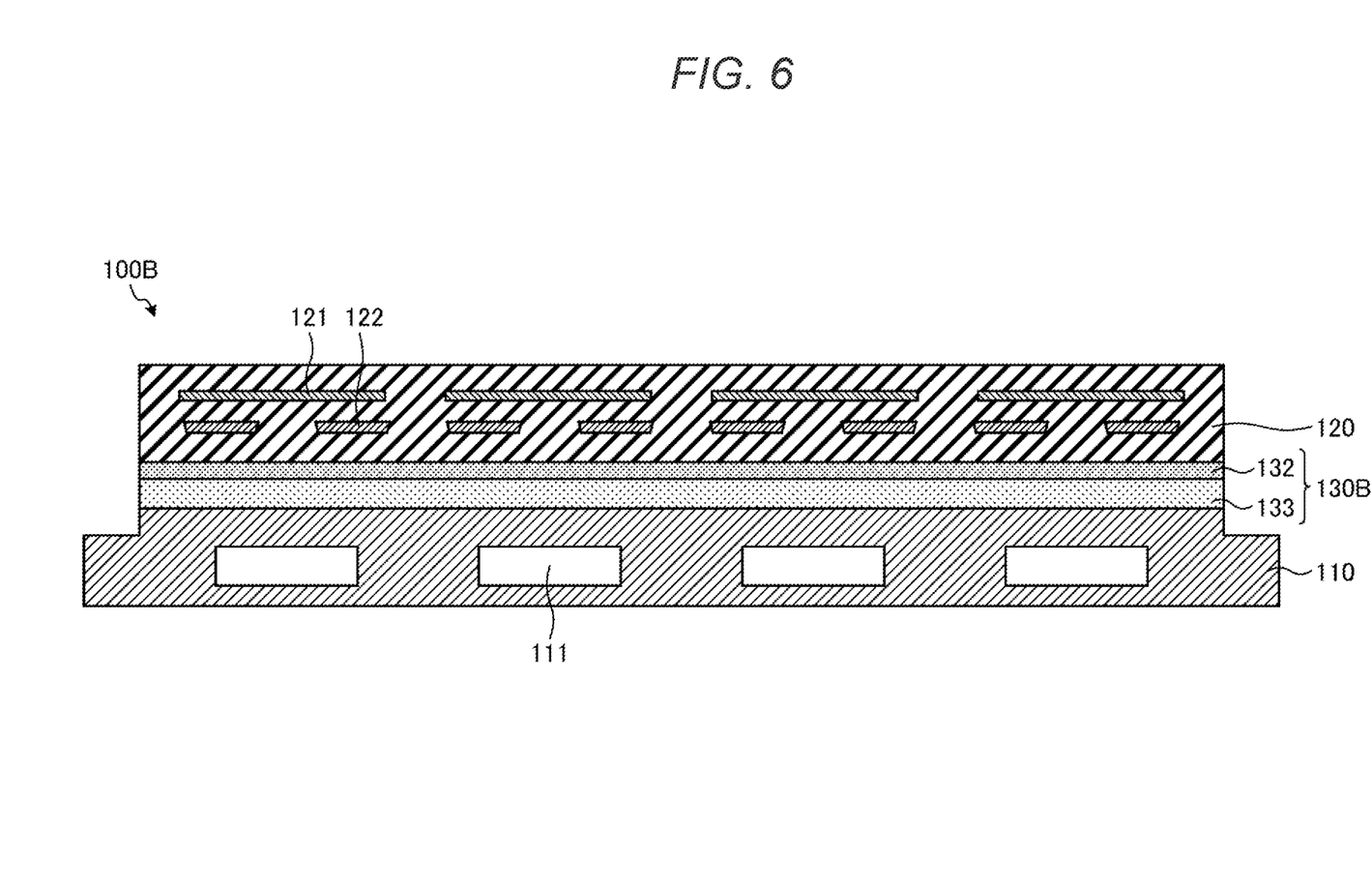
FIG. 6 is a schematic view showing a cross section of an electrostatic chuck according to a second modified embodiment of the embodiment.

In addition, when the bonding layer is formed of one or more laminated adhesives, at least one of the one or more adhesives may have a temperature of −70° C. or lower corresponding to the extreme value of the loss tangent in the temperature range of −150° C. to 250° C. For example, for only one of the one or more adhesives forming the bonding layer, the temperature corresponding to the extreme value of the loss tangent in the temperature range of −150° C. to 250° C. may be −70° C. or lower. A modified example in this case is shown in FIG. 6. FIG. 6 is a schematic view showing a cross section of an electrostatic chuck 100B according to a second modified embodiment. As shown in FIG. 6, in the electrostatic chuck 100B according to the second modified embodiment, a resin layer 130B is formed by laminating a sheet-like first adhesive 133 and a sheet-like second adhesive 132. The first adhesive 133 is laminated on the base plate 110. The second adhesive 132 is laminated between the first adhesive 133 and the ceramic plate 120. The second adhesive 132 of the first adhesive 133 and the second adhesive 132 has a temperature of −70° C. or lower corresponding to the extreme value of the loss tangent in the temperature range of −150° C. to 250° C. On the other hand, in the case of the first adhesive 133, the temperature corresponding to the extreme value of the loss tangent is higher than 70° C. In this case, the viscosity before thermosetting and the storage elastic modulus after thermosetting of the first adhesive 133 may be greater than those of the second adhesive 132. Thereby, since the hardness of the first adhesive 133 is maintained as appropriate, the thickness of the resin layer 130B can be appropriately adjusted by the thickness of the first adhesive 133. In the example of FIG. 6, the thickness of the first adhesive 133 is greater than the thickness of the second adhesive 132. For example, the thickness of the first adhesive 133 is about 0 to 1 mm, and the thickness of the second adhesive 132 is about 0.05 to 0.5 mm.

Note that, in the examples of FIG. 5 and FIG. 6, the resin layers 130A and 130B were formed by laminating adhesives of two layers. However, the resin layer may be formed by laminating adhesives of three or more layers.

(Other Modified Embodiments)

Note that, in the electrostatic chuck 100 described above, the thermal conductivity of the resin layer 130 may be improved by containing a filler such as aluminum oxide, silicon carbide or zinc oxide in the resin layer 130. In addition, from a viewpoint of improving the adhesiveness between the base plate 110 and the ceramic plate 120 by the resin layer 130, a silane coupling layer may be provided on the upper surface and the lower surface of the resin layer 130, as required.

As described above, the electrostatic chuck (for example, electrostatic chuck 100) according to the embodiment includes a base plate (for example, base plate 110), a ceramic plate (for example, ceramic plate 120), and a resin layer (for example, a resin layer 130; 130A; 130B). The ceramic plate is fixed to the base plate, and is configured to adsorb a target object by an electrostatic force generated by energization to an embedded electrode. The resin layer is a resin layer for bonding the base plate and the ceramic plate, and is formed of one or more laminated adhesives, and at least one of the one or more adhesives has a temperature of −70° C. or lower corresponding to an extreme value of a loss tangent in a temperature range −150° C. to 250° C. Thereby, according to the electrostatic chuck of the embodiment, it is possible to suppress destruction of the resin layer at a low temperature, and as a result, to obtain sufficiently high temperature uniformity.

In addition, at least one of the one or more adhesives may have a thermal conductivity of 0.5 W/mK or more at −60° C. Thereby, according to the electrostatic chuck of the embodiment, it is possible to suppress decrease in thermal conductivity of the resin layer at the low temperature.

Further, at least one of the one or more adhesives may contain a filler. Thereby, according to the electrostatic chuck of the embodiment, it is possible to improve the thermal conductivity of the resin layer.

Further, the resin layer may include a first adhesive (for example, first adhesive 131; 133) applied to the base plate, and a second adhesive (for example, second adhesive 132) applied between the first adhesive and the ceramic plate. At least one of the first adhesive and the second adhesive may have a temperature of −70° C. or lower corresponding to the extreme value of the loss tangent in the temperature range of −150° C. to 250° C. Thereby, according to the electrostatic chuck of the embodiment, deformation of the resin layer at the low temperature is promoted and displacement in a horizontal direction is absorbed, so that the destruction of the resin layer at the low temperature can be further suppressed.

Further, one of the first adhesive and the second adhesive may have the temperature of −70° C. or lower corresponding to the extreme value of the loss tangent in the temperature range of −150° C. to 250° C. In addition, the viscosity before thermosetting and the storage elastic modulus after thermosetting of the other of the first adhesive and the second adhesive may be greater than those of one of the first adhesive and the second adhesive. Thereby, according to the electrostatic chuck of the embodiment, it is possible to appropriately adjust the thickness of the resin layer.

Further, the thickness of the other of the first adhesive and the second adhesive may be greater than the thickness of one of the first adhesive and the second adhesive. Thereby, according to the electrostatic chuck of the embodiment, it is possible to appropriately adjust the thickness of the resin layer.

What is claimed is:

1. An electrostatic chuck comprising:
    a base plate;
    a ceramic plate fixed to the base plate and including an electrode embedded in the ceramic plate; and
    a resin layer bonding the base plate and the ceramic plate and including one or more adhesives,
    wherein in at least one of the one or more adhesives, a temperature corresponding to an extreme value of a loss tangent in a temperature range of −150° C. to 250° C. is −70° C. or lower, and
    a value of a storage modulus of the resin layer at a low temperature of −60° C. or lower and a value of the storage modulus of the resin layer at room temperature is maintained at a same level.

2. The electrostatic chuck according to claim 1, wherein the at least one of the one or more adhesives has a thermal conductivity of 0.5 W/mK or more at −60° C.

3. The electrostatic chuck according to claim 1, wherein the at least one of the one or more adhesives contains a filler.

4. The electrostatic chuck according to claim 1, wherein the resin layer has:
    a first adhesive applied to the base plate, and
    a second adhesive applied between the first adhesive and the ceramic plate, and
    wherein in at least one of the first adhesive and the second adhesive, a temperature corresponding to the extreme value of the loss tangent in the temperature range of −150° C. to 250° C. is −70° C. or lower.

5. The electrostatic chuck according to claim 4, wherein in one of the first adhesive and the second adhesive, a temperature corresponding to the extreme value of the loss tangent in the temperature range of −150° C. to 250° C. is −70° C. or lower, and
    wherein a viscosity before thermosetting and a storage elastic modulus after thermosetting of the other of the first adhesive and the second adhesive are greater than those of the one of the first adhesive and the second adhesive.

6. The electrostatic chuck according to claim 5, wherein a thickness of the other of the first adhesive and the second adhesive is greater than a thickness of the one of the first adhesive and the second adhesive.

7. The electrostatic chuck according to claim 1, further comprising:
    a silane coupling layer provided on an upper surface or a lower surface of the resin layer.

* * * * *